US012710468B2

(12) United States Patent
Amelio

(10) Patent No.: US 12,710,468 B2
(45) Date of Patent: Aug. 18, 2026

(54) METHOD AND SYSTEM OF DEVELOPING AND EXECUTING TEST PROGRAM FOR VERIFYING DUT

(71) Applicant: Microtest S.p.A., Vicopisano (IT)

(72) Inventor: Giuseppe Amelio, San Pietro (IT)

(73) Assignee: MICROTEST S.P.A., Vicopisano (IT)

( * ) Notice: Subject to any disclaimer, the term of this patent is extended or adjusted under 35 U.S.C. 154(b) by 96 days.

(21) Appl. No.: 18/620,476

(22) Filed: Mar. 28, 2024

(65) Prior Publication Data

US 2024/0337683 A1 Oct. 10, 2024

(30) Foreign Application Priority Data

Apr. 6, 2023 (EP) .................................... 23167023

(51) Int. Cl.
*G01R 31/28* (2006.01)
*G01R 31/3183* (2006.01)

(52) U.S. Cl.
CPC ..... *G01R 31/2834* (2013.01); *G01R 31/2846* (2013.01); *G01R 31/318307* (2013.01)

(58) Field of Classification Search
CPC ............ G01R 31/2834; G01R 31/2846; G01R 31/318307; G01R 31/31907; G01R 31/318314
USPC ..................................................... 324/762.01
See application file for complete search history.

(56) References Cited

U.S. PATENT DOCUMENTS 4,894,829 A * 1/1990 Monie .............. G01R 31/31912 717/109
6,205,407 B1 * 3/2001 Testa ............. G01R 31/318307 716/136
2003/0004663 A1 1/2003 Masella et al.
2005/0171722 A1 * 8/2005 Fritzsche ......... G01R 31/31907 702/122
2006/0156137 A1 * 7/2006 Raul .............. G01R 31/318307 714/738
2014/0358514 A1 * 12/2014 Liu ..................... G06F 11/3688 703/22
2016/0238657 A1 8/2016 Czamara et al.
(Continued)

OTHER PUBLICATIONS

European Seacrh Report for EP 23167023.3 dated Sep. 28, 2023.

*Primary Examiner* — Roberto Velez
(74) *Attorney, Agent, or Firm* — Potomac Law Group, PLLC; John (Jack) J. Penny, Jr.

(57) ABSTRACT

The present disclosure relates to a method and system of developing and executing a test program for verifying a device under test (DUT). The method comprises: receiving, by a test specification generating module, test data in order to generate a test specification including information for generating a test program; receiving, by a code generating module, the information output from the test specification generating module in order to generate the test program; executing, by an automatic test equipment (ATE), the test program to verify the device under test; acquiring, by an oscilloscope module, signals at device under test during verifying the device under test; and feeding an output of the oscilloscope module, which is based on the signals, back to the test specification generating module, wherein the test specification generating module is integrated with artificial intelligence (AI) to analyze the output of the oscilloscope module in order to automatically optimize the test program and perform quality checks.

9 Claims, 10 Drawing Sheets

(56) References Cited

U.S. PATENT DOCUMENTS

| | | | | |
|---|---|---|---|---|
| 2022/0373597 | A1* | 11/2022 | Agoston .......... | G01R 31/31908 |
| 2023/0057479 | A1* | 2/2023 | Pickerd .............. | G01R 31/2834 |
| 2024/0235669 | A1* | 7/2024 | Pickerd .............. | H04B 10/0731 |

* cited by examiner

700

900

SPI_1_MAP

Address width 12
Data width 16

| Register Name | Address | Field Name | Type | Bit Offset | Bit Width | Reset Value | Reset Sources | Description | Note |
|---|---|---|---|---|---|---|---|---|---|
| DSI3 Channel Control | 0x000 | | | | | | | | |
| | | unused | RW | 12 | 4 | 0x0 | | | |
| | | Chx_EN | RW | 0 | 12 | 0x000 | | DSI-3 Channel Enable<br>When this bit is set, the corresponding DSI-3 channel will be enabled. | 0: Disable<br>1: Enable |
| DSI3 Channel Control | 0x001 | | | | | | | | |
| | | unused | RW | 1 | 15 | 0x0000 | | | |
| | | CRM_FIFO_CLR | RW | 0 | 1 | 0x0 | | CRM FIFO Clear<br>When this bit is set, the CRM FIFO will be cleared. | 0: Disable<br>1: Enable (Clear) |
| DSI3 Channel Control | 0x002 | | | | | | | | |
| | | unused | RW | 12 | 4 | 0x0 | | | |
| | | Chx_CRM_CLR | RW | 0 | 12 | 0x000 | | CRM Buffer Clear<br>When this bit is set, the CRM buffer will be "cleared", and associated status/error bits will be reset to initial values. (The "cleared" here means that after this bit is set, the sC will respond with zero data when uC read the buffer.) | 0: Disable<br>1: Enable (Clear) |
| DSI3 Channel Control | 0x003 | | | | | | | | |
| | | unused | RW | 12 | 4 | 0x0 | | | |

FIG. 9

METHOD AND SYSTEM OF DEVELOPING AND EXECUTING TEST PROGRAM FOR VERIFYING DUT

Priority is claimed under 35 U.S.C. § 119 (a) to European Application No. 23167023.3 filed on Apr. 6, 2023, the contents of which are incorporated by reference in its entirety.

TECHNICAL FIELD

The present disclosure is generally directed to the field of testing electronics with automatic test equipment (ATE), and more particularly, to a method and system of developing and executing a test program for verifying several different typologies of devices under test (DUT).

BACKGROUND

Automatic test equipment (ATE), also known as a tester, is commonly used to test both semiconductor devices and assembled printed circuit boards to determine whether the devices and/or boards are defective.

In general, an ATE operator develops test signals and test sequences on the ATE for subsequent testing of a device under test (DUT), which may be either a semiconductor device or a printed circuit board.

The ATE operator then enters commands to start a test, thereby causing the ATE to apply the test signals to the DUT and receive output signals produced by the DUT in response to the applied test signals. The ATE then typically compares the received output signals with stored expected values.

The ATE also typically measures various parameters associated with the DUT, such as the amount of current drawn during various operating conditions or the frequency of various output signals, and then compares these values with other expected values. If any of the received signals or measured values do not match the corresponding expected values, then the ATE typically indicates that the DUT presents some defects.

A DUT may include just digital or analog circuitry, or both types of circuitries. Moreover, a DUT that includes both types of circuitries is generally known as a mixed-signal device, and ATEs that test these devices are generally known as mixed-signal ATEs.

In addition, a test program including the test signals and test sequences may be generated by an automatic code generator, and then the test program may be run on the ATE for verifying the DUT. In order to generate the test program, a test specification tool may be used in combination with the automatic code generator, which may be a software for test specification assisted writing.

However, there is still a need to improve the automatic of the test process of the DUT, especially the automatic optimization of the test program to be run on the ATE for verifying the DUT.

More specifically, it would be desirable to develop test programs that could be easily modified according to the different DUT to be tested thus reducing the working hour to develop different test programs.

SUMMARY

An embodiment of the present invention relates to a method of developing and executing a test program for verifying a device under test (DUT), comprising:

receiving, by a test specification generating module, test data in order to generate a test specification including information for generating a test program;

receiving, by a code generating module, the information output from the test specification generating module in order to generate the test program;

executing, by an automatic test equipment (ATE), the test program to verify the device under test;

acquiring, by an oscilloscope module, signals on pins of the device under test during the verifying phase of the device under test; and feeding an output of the oscilloscope module, which is based on the signals, back to the test specification generating module, wherein the test specification generating module is integrated with an artificial intelligence (AI) module to analyze the output of the oscilloscope module in order to automatically optimize the test program and perform quality checks.

According to at least one embodiment of the present invention, oscilloscope module output is further analyzed by the integrated AI module in order to automatically replicate all test setups of the test program to be executed on another ATE.

According to at least one embodiment of the present invention, the receiving phase of the test data, performed by the test specification generating module, in order to generate a test specification including information for generating a test program comprises:

configuring the test data with a support of graphical programming.

According to at least one embodiment of the present invention, the graphical programming is implemented in a graphical interface, in which analog/digital programming and measurement of the pins of the DUT are defined with filing suggested parameters, and meta language setup are listed and ordered to define an instruction sequence.

According to at least one embodiment of the present invention, the test data includes a traceability matrix, a DUT register map, a setup description, an optical character recognition (OCR) description of the DUT, and a standard test data file (STDF).

According to at least one embodiment of the present invention, the traceability matrix includes a list of requirements/parameters to be covered by a test in the test program.

According to at least one embodiment of the present invention, the DUT register map includes communication protocol information, and DUT internal register structure.

According to at least one embodiment of the present invention, the setup description is created for each requirement and includes a list of requirements/parameters to be verified in the test program.

According to at least one embodiment of the present invention, a text semantic analysis is performed on the OCR description of the DUT through the AI integrated in the test specification generating module.

According to at least one embodiment of the present invention, the test specification generating module is integrated with Jig single site schematic management in order to drive additional hardware.

Another embodiment of the present invention relates to a system of developing and executing a test program for verifying a device under test (DUT), comprising:

a test specification generating module configured to receive test data in order to generate a test specification including information for generating a test program;

a code generating module configured to receive the information output from the test specification generating module in order to generate the test program;

an automatic test equipment (ATE) configured to execute the test program to verify the device under test; and an oscilloscope module configured to acquire signals on pins of the device under test during verifying the device under test, and feed an output of the oscilloscope module, which is based on the signals, back to the test specification generating module, wherein the test specification generating module is integrated with artificial intelligence (AI) to analyze the output of the oscilloscope module in order to automatically optimize the test program and perform quality checks.

According to at least one embodiment of the present invention, the output of the oscilloscope module is further analyzed by the integrated AI in order to automatically replicate all test setups of the test program to be executed on another ATE.

Features and advantages of at least one embodiment of the present invention will be disclosed with reference to the enclosed drawings relating to an indicative and a non-limiting implementation example.

BRIEF DESCRIPTION OF THE DRAWINGS

FIG. 9 is an illustrative diagram showing an example of a register map according to an embodiment of the present invention.

DETAILED DESCRIPTION

Figure 1:
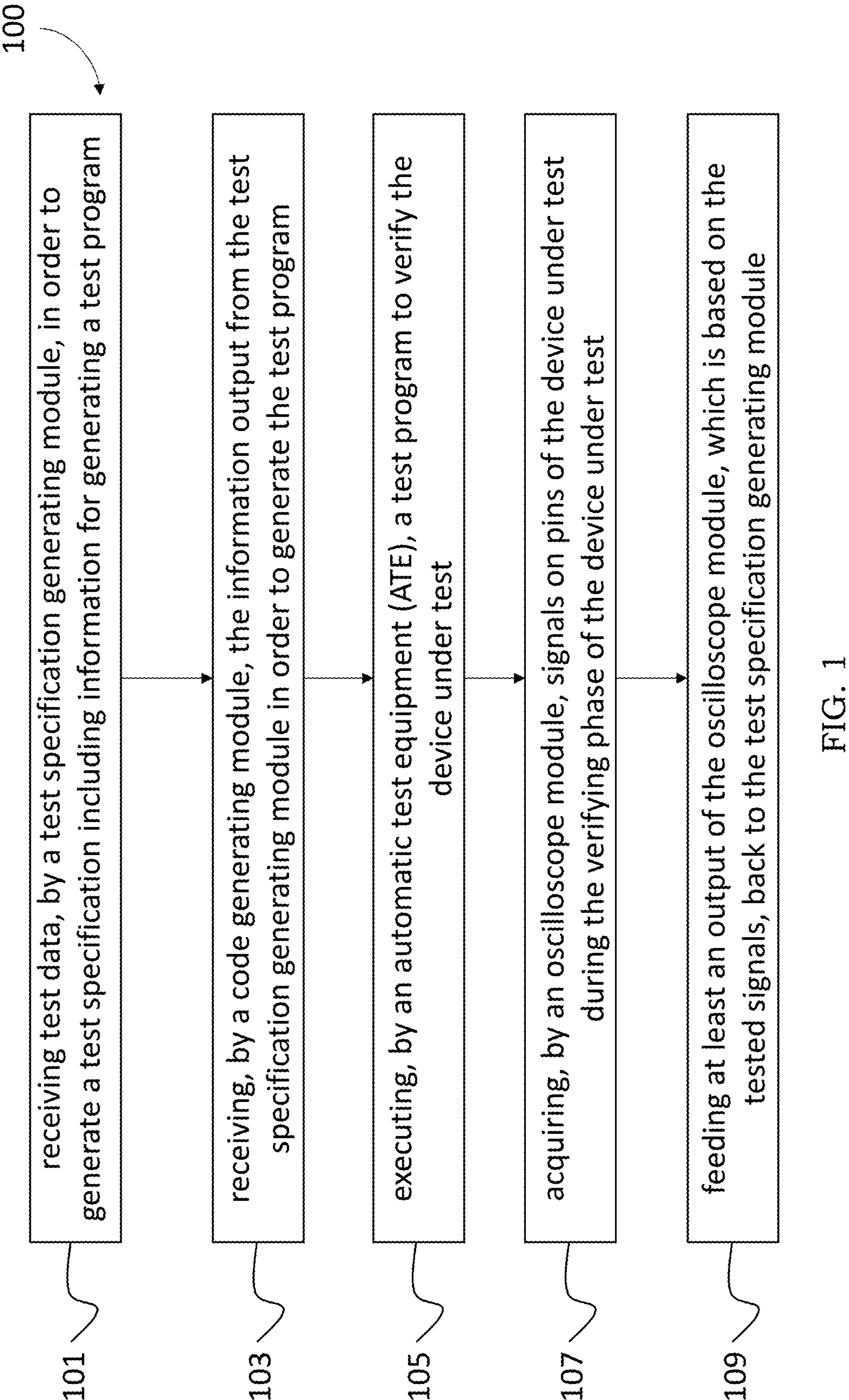
FIG. 1 is a flow chart of a method of developing and executing a test program for verifying a device under test (DUT) according to at least one embodiment of the present invention.

In the following detailed description, reference is made to the accompanying drawings that form a part hereof and in which is shown, by way of illustration, specific embodiments. In the drawings, like numerals describe substantially similar components throughout the several views. Other embodiments may be disclosed and structural changes may be made without departing from the scope of the present disclosure. The following detailed description is, therefore, not to be taken in a limiting sense.

FIG. 1 is a flow chart of a method 100 of developing and executing a test program for verifying a device under test (DUT) according to at least one embodiment of the present invention.

According to such an embodiment, the method 100 comprises a step or phase 101 of receiving test data, by a test specification generating module, in order to generate a test specification including information for generating a test program.

A subsequent a step 103 is provided for receiving the information output from the test specification generating module, by a code generating module, in order to generate a test program.

A further step 105 includes an executing phase of a test program, performed by an automatic test equipment (ATE), to validate the test program and verify the device under test.

A subsequent phase or step 107 is provided for acquiring, by an oscilloscope module, signals on pins of the device under test during the verifying phase of the device under test.

Advantageously, a further step 109 is foreseen for feeding at least an output of the oscilloscope module, which is based on the tested signals, back to the test specification generating module.

In at least one embodiment of the present invention, the test specification generating module is integrated with an artificial intelligence (AI) module configured to analyze the output of the oscilloscope module in order to automatically optimize the test program and perform quality checks.

In at least one embodiment of the present invention, the test specification generating module may be a test specification tool, which is a software for test specification assisted writing. The specification tool, in combination with the automatic code generator, is configured for automatically generating a one-site test program for a platform ready to be run on the ATE and/or simulator.

In at least one embodiment of the present invention, within the specification tool, test setups can be described at high level even without any knowledge about the final ATE platform. This testing setup phase can be described with the support of graphical programming without the knowledge of any specific programming language and can be further described directly with the support of the device designer that has the full device functionality knowledge.

In addition, it is possible to allow to link test requirements directly to each test setup for a better traceability and allow to retrofit and track the modification done by the test engineer during the on-line debug.

According to at least one embodiment of the present invention, the output of the oscilloscope module is further analyzed by the integrated in the AI module in order to automatically replicate all test setups of the test program to be executed on another ATE.

In at least one embodiment of the present invention, the integration of AI can reduce the test program implementation time in all development phases: a test specification definition starting from the device datasheet, a test setup description, an automatic test program generation, and a test program improvement and validation.

Moreover, the advantage to have a new silicon characterization test program in a very short time, is the possibility to detect and feedback design issue or weakness as fast as possible to the design group.

In at least one embodiment of the present invention, the oscilloscope module may include an oscilloscope that has a high number of channels (256 channels, for example) which can be used to acquire signals on DUT pins in order to speed up the test program development and validation or platform migration.

Further, starting from an existing test program running on the ATE, oscilloscope signals can be acquired and analyzed by the integrated AI, in order to automatically replicate all test setup inside a specification tool project and generate the test program on a new target ATE platform.

Moreover, during the test program validation on the target ATE platform, oscilloscope signals can be acquired and analyzed by the integrated AI module, in order to automatically perform test program improvement and quality checks (e.g., spike analysis).

Traditionally, performing quality checks, such as spike analysis, is a best practice for qualifying draft test programs before their release to mass production testing. Spike analysis involves verifying that no dangerous electrical conditions, such as overshoot or undershoot during fast transient signals, which exceed the absolute maximum rating of any DUT pin, can be generated by the ATE all over the full test program flow execution. Such undesired events have the potential to damage or degrade the performance of the DUT or testing hardware. Typically, the test engineer uses a manual or automatic oscilloscope to measure voltage and current signals on each DUT pin throughout the full test flow for each test setup.

If a spike event is triggered by the oscilloscope, the test engineer will initiate a check and modify loop of the test program in order to remove any detected single spike event during the automatic or manual oscilloscope signal analysis. The test engineer will apply specific corrective actions to the test program to remove dangerous electrical signals at the DUT pin until every single spike event is eliminated.

This activity is time-consuming and not error-free. Human error can impact the quality of the analysis results, for instance, incorrect oscilloscope settings during acquisition can mask spike events and prevent the test engineer from detecting and resolving the issue.

Advantageously, according to the present disclosure, the integrated AI module can perform quality checks such as spike analysis automatically, using information from the automated test specification document analysis. In at least one embodiment of the present invention, the AI module can directly apply the correct settings to the oscilloscope, run the test program, and in case of any undesired events triggered by the oscilloscope, analyze the oscilloscope output signal and initiate the check and modify loop to the test program. The AI module can automatically apply modifications to the tests setup in order to solve the issue.

The AI module can support the test engineer in the qualification process of the draft test program, which can reduce the time required for final test program release to mass production testing and improve the coverage and quality of the results.

The AI module comprises several neural networks, which are designed and trained to analyze and categorize electrical signals at the DUT pins based on their electrical characteristics, such as analog/digital, periodic signals, voltage or current ramps, arbitrary waveforms, digital communication frames, and the like. This enables the AI module to recognize any kind of signal that can be generated by the ATE on the DUT input pins or by the DUT itself on its output pins.

Additionally, the trained AI module can be used to automatically replicate an existing test program running in mass production testing to perform ATE platform migration of the testing solution.

By running the test program on the existing production ATE platform, a full test flow STDF file will be collected and imported into the spec tool, in order to replicate the test program structure in terms of tasks and requirements.

As is known in the art, STDF stands for Standard Test Data Format, which is a standard file format used for recording and exchanging test data in the manufacturing and testing of integrated circuits. An STDF file may be a binary file that contains information about the data generated during the testing process, such as the name of the test program, the test equipment and parameter settings, test results, and fault analysis.

STDF files are typically generated by test equipment such as the ATE, and then sent to IC manufacturers or testing laboratories for analysis and archival. Testing laboratories can use STDF files to check the performance of the testing process, validate the accuracy of test data, evaluate the effectiveness of test programs, and optimize the testing process.

STDF files can also be used for data exchange, as they provide a standardized format for sharing test data. Additionally, the standardized format of STDF files makes it possible to convert and compare data between different testing equipment and systems.

The information included in an STDF file may vary depending on the type of test equipment and the specific test program used in the manufacturing and testing of integrated circuits. However, some of the information in the STDF file may include:

Test program information. It may include the name of the test program, the version of the program, and the name of the test engineer who created the program;

Test equipment information. It may include the name and model of the test equipment used, the software version, and the calibration data for the equipment;

Test results. It may include the measured values of each test parameter, such as voltage, current, and timing data.

Failure analysis data. It may include any faults or failures detected during testing, along with the failure mode, failure description, and the location of the failure on the device.

Statistical data. It may include statistical summaries of test results, such as minimum, maximum, average, and standard deviation values for each parameter.

Bin information. It may include the mapping of measured values to specific categories or bins, which are used to classify the devices based on their performance.

Test program flow information. It may include the sequence of test steps and conditions, and the dependencies between them.

Overall, the information included in an STDF file may provide a comprehensive record of the testing process, which can be used for quality control, data analysis, and process optimization.

For each test flow task inside the STDF file, a corresponding task will be created in the spec tool and filled with the relevant requirements. Each test executed in the test program becomes a requirement within the spec tool. The oscilloscope is programmed to capture all signals at DUT pins for each setup that corresponds to every single requirement from the STDF import.

The output of the oscilloscope acquisition serves as input for the AI module, which processes the data through the trained neural networks and automatically fills the setups description within the spec tool. These setups are then applied to the ATE pins to verify every parameter and measurement present in the current mass production test program, ensuring complete test coverage for all DUT parameters.

According to further embodiments of the present invention, the step 101 may include a configuration phase of the test data with a support of graphical programming.

Advantageously, with the support of the graphical programming, the test setups can be described without the knowledge of any specific programming language.

Moreover, the graphical programming may be implemented in a graphical interface, in which analog/digital programming and measurement of the pins of the DUT are defined with the possibility of filing suggested parameters and meta language setup that are listed and ordered to define an instruction sequence.

Advantageously, the test data may further include one or more of the following features:

a traceability matrix;

a DUT register map;

a setup description;

a digitalized test specification or an optical character recognition (OCR);

description of the DUT; and a standard test data file (STDF).

According to at least one embodiment of the present invention, the traceability matrix may include a list of requirements/parameters to be covered by a test in the test program.

Moreover, the DUT register map may include communication protocol information and DUT internal register description.

According to at least one embodiment of the present invention, the setup description may be created for each requirement and include a list of requirements/parameters to be verified in the test program.

According to at least one embodiment of the present invention, a text semantic analysis may be performed on the digitalized OCR description of the DUT through the AI integrated in the test specification generating module.

Finally, the test specification generating module may be integrated with Jig single site schematic management in order to drive additional hardware.

Figure 2:
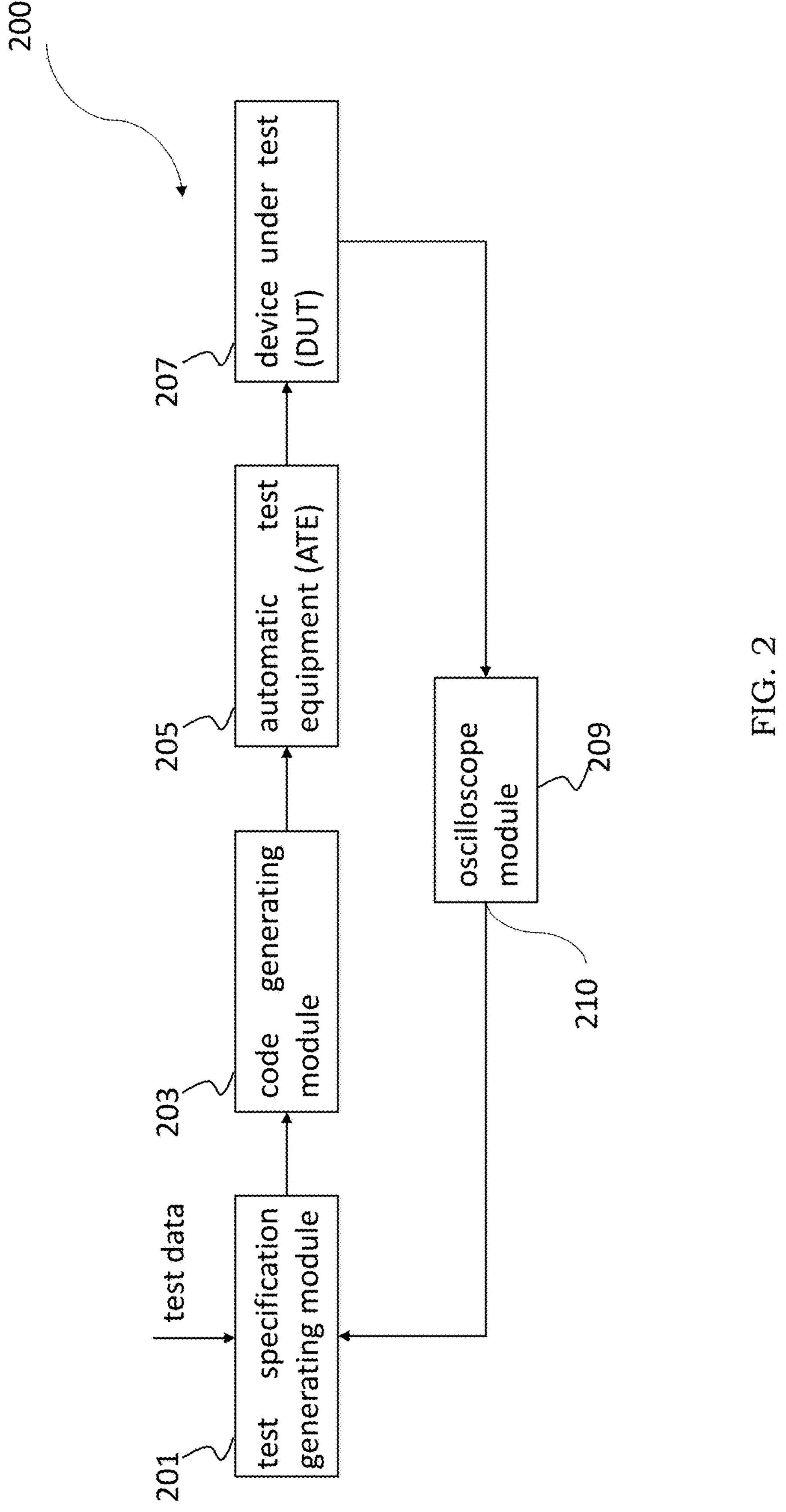
FIG. 2 is a block diagram showing a system of developing and executing a test program for verifying a device under test (DUT) according to an embodiment of the present invention.

FIG. 2 is a block diagram showing a system 200 of developing and executing a test program for verifying a Device Under Test 207 according to at least one embodiment of the present invention.

The system 200 includes a test specification generating module 201, which is configured to receive test data in order to generate a test specification including information for generating a test program.

A code generating module 203 is also provided and is configured to receive the information output from the test specification generating module 201 in order to generate the test program.

An automatic test equipment (ATE) 205 is configured to execute the test program to verify the DUT 207.

Advantageously, an oscilloscope module 209 is configured to acquire signals on pins of the DUT 207 during the verifying phase of the DUT 207.

At least an output 210 of the oscilloscope module 209 is feedback coupled to the test specification generating module 201 for feeding such a module with which are based on the test signals.

Advantageously, the test specification generating module 201 is integrated with an artificial intelligence (AI) module for analyzing the outputs 210 of the oscilloscope module 209 in order to automatically optimize the test program and perform quality checks.

In at least one embodiment of the present invention, the outputs 210 of the oscilloscope module 209 are further analyzed by the integrated AI module in order to automatically replicate all test setups of the test program to be executed on another and different ATE.

Advantageously, the integrated AI module can perform quality checks such as spike analysis automatically, using information from the automated test specification document analysis.

The AI module may comprise several neural networks, which are designed and trained to analyze and categorize electrical signals at the DUT pins based on their electrical characteristics, such as analog/digital, periodic signals, voltage or current ramps, arbitrary waveforms, digital communication frames, and the like. This enables the AI module to recognize any kind of signal that can be generated by the ATE on the DUT input pins or by the DUT itself on its output pins.

The output of the oscilloscope acquisition serves as input for the AI module, which processes the data through the trained neural networks and automatically fills the setups description within the spec tool. These setups are then applied to the ATE pins to verify every parameter and measurement present in the current mass production test program, ensuring complete test coverage for all DUT parameters.

In at least one embodiment of the present invention, the AI module can directly apply the correct settings to the oscilloscope, run the test program, and in case of any undesired events triggered by the oscilloscope, analyze the oscilloscope output signal and initiate the check and modify loop to the test program. The AI module can automatically apply modifications to the tests setup in order to solve the issue.

The AI module can support the test engineer in the qualification process of the draft test program, which can reduce the time required for final test program release to mass production testing and improve the coverage and quality of the results.

Additionally, the trained AI module can be used to automatically replicate an existing test program running in mass production testing to perform ATE platform migration of the testing solution.

By running the test program on the existing production ATE platform, a full test flow STDF file will be collected and imported into the spec tool, in order to replicate the test program structure in terms of tasks and requirements.

For each test flow task inside the STDF file, a corresponding task will be created in the spec tool and filled with the relevant requirements. Each test executed in the test program becomes a requirement within the spec tool.

The oscilloscope is programmed to capture all signals at DUT pins for each setup that corresponds to every single requirement from the STDF import.

Figure 3:
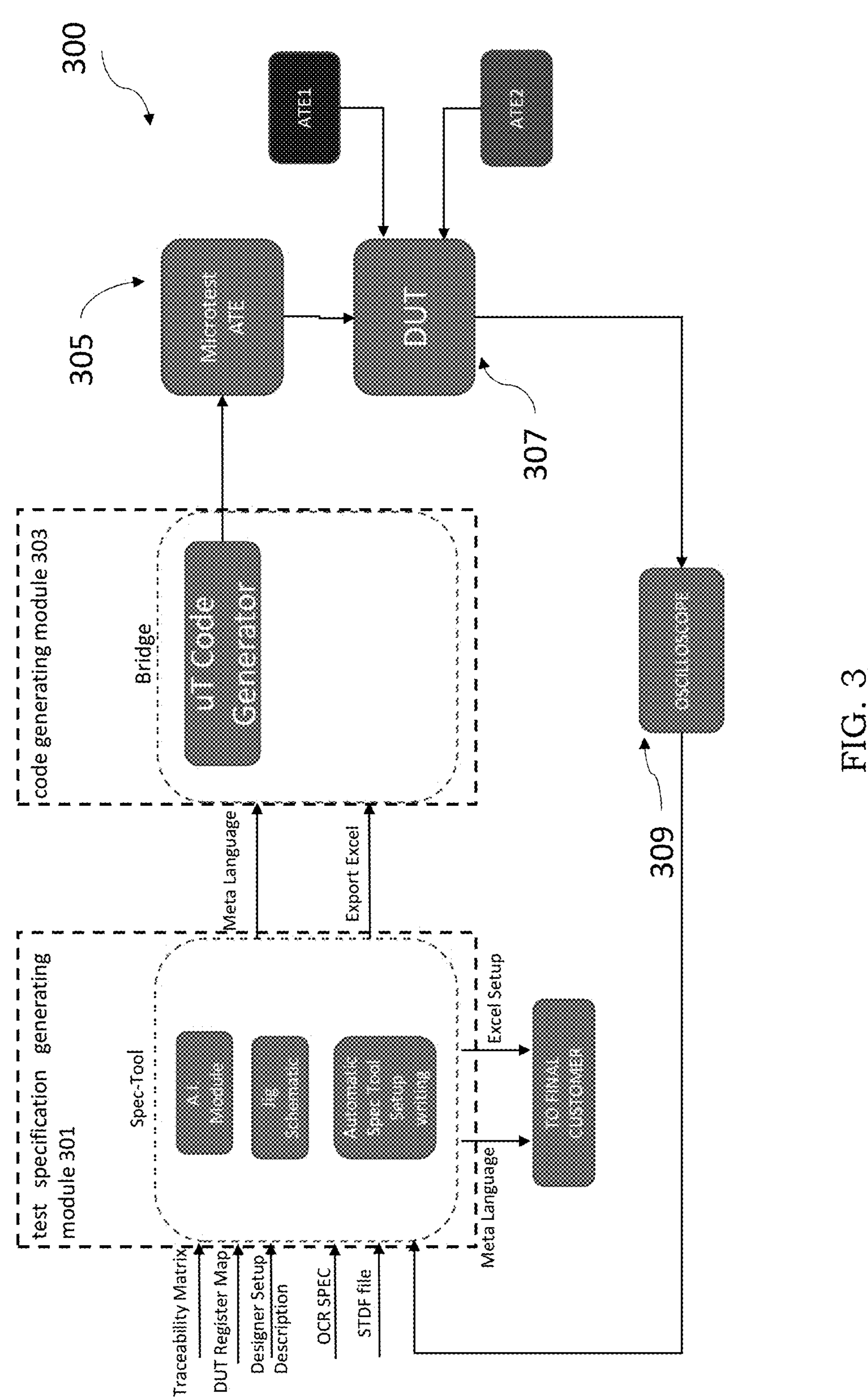
FIG. 3 is a detailed diagram showing the system of developing and executing a test program for verifying a DUT of FIG. 2 according to an embodiment of the present invention.

FIG. 3 is a detailed diagram 300 showing the system according to the present disclosure for developing and executing a test program for verifying a DUT included in the blocks of FIG. 2.

In the embodiment of FIG. 3, the test specification generating module 301, the code generating module 303, the automatic test equipment (ATE) 305, the device under test (DUT) 307, and the oscilloscope module 309 are identical in function to those discussed with reference to the FIGS. 1 and 2.

As shown in FIG. 3, the test specification generating module 301, i.e., the spec-tool, may implement a series of functions, for instance:

the import of a test program structure, tests and limits from an existing STDF file, implement the import of the list of requirements from the device specification with OCR and text semantic analysis (optionally with the support of the AI module), improve the Jig single site schematic management in order to drive additional hardware (i.e., uT Transceiver or general purpose electronics), implement the import of the oscilloscope output in order to replicate the test program setups running on other ATE platform, and implement automatic setup generation starting from the oscilloscope signals (with the support of AI module).

Moreover, as shown in FIG. 3, the test specification generating module 301 may be integrated with a DUT based Pin setup simulator, a possibility to implement iterations (For, While) and conditioning (if) in the setup description, and a possibility to import ATE specific library function to be used in the setup description.

The code generating module 303 shown in FIG. 3 may include a code generating platform, such as uT Code Generator. However, the present invention is not limited thereto. Other different platforms can be applicable.

In other words, the output from the test specification generating module 301 may be applied to different platforms for verifying the DUT 307. Accordingly, the automatic test equipment (ATE) 305 may relate to corresponding simulators at ATE level. It should be noted that a test operator can select one from these platforms to carry out the test of the DUT 307. Accordingly, corresponding ATE (ATE1, ATE2, for example) can be involved.

Figure 4:
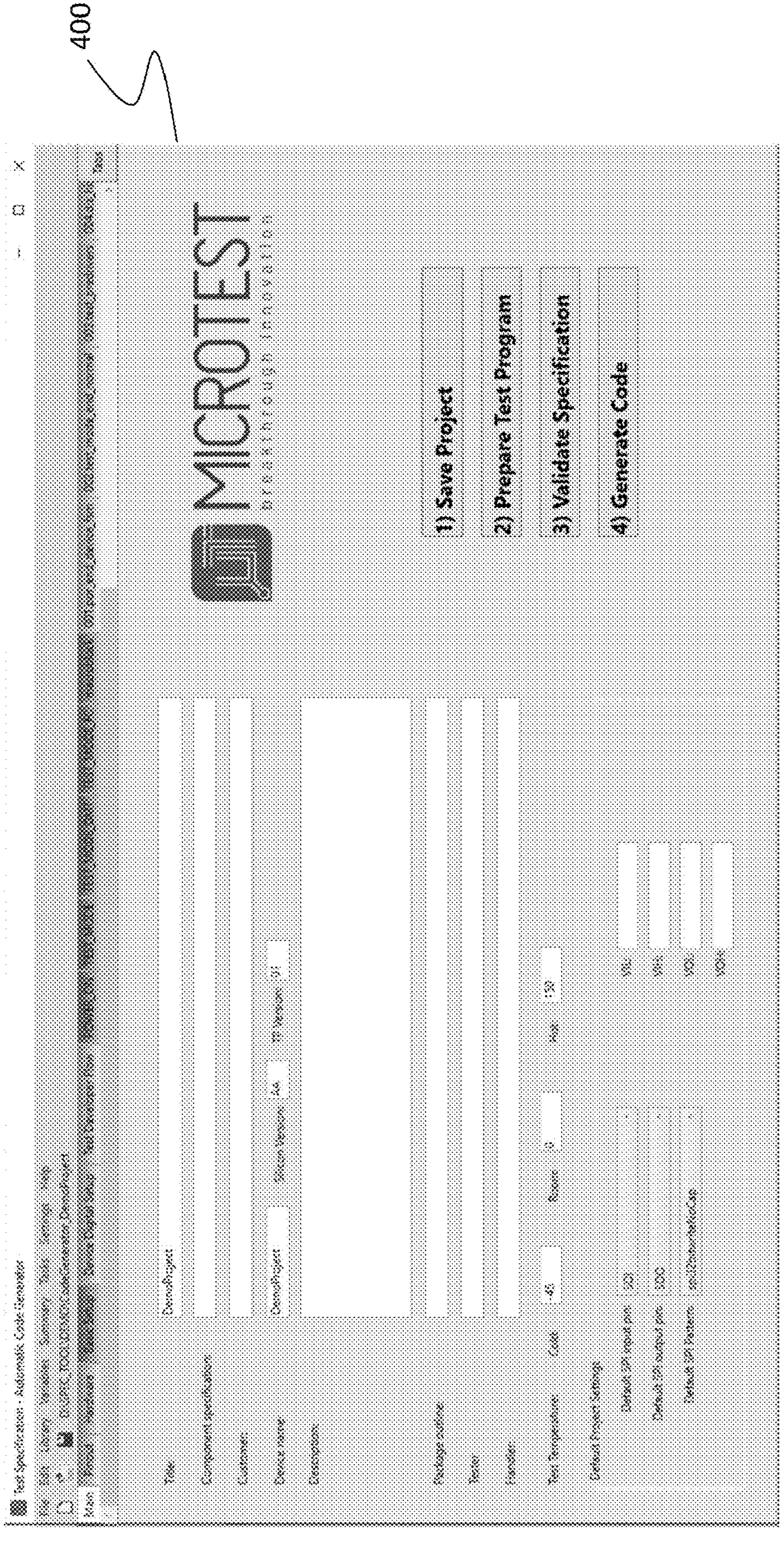
FIG. 4 is an illustrative diagram showing an example of a test specification generating module of the system of developing and executing a test program for verifying a DUT according to an embodiment of the present invention.

FIG. 4 is an illustrative diagram showing an example 400 of a test specification generating module of the system for developing and executing a test program for verifying a DUT according to at least one embodiment of the present invention.

As mentioned above, the test specification generating module may be a test specification tool, which is a software product for test specification assisted writing. In combination with the automatic code generator, the specification tool can automatically generate a single on-site test program for a platform ready to be run on the ATE and/or a simulator.

In at least one embodiment of the present invention, within the specification tool, test setups can be described at high level without any knowledge about the final ATE platform and described to the user with the support of graphical programming without the knowledge of any specific programming language.

These features are described directly with the support of the device designer that has the full device functionality knowledge. In addition, it is possible to allow to link test requirements directly to each test setup for traceability, and allow to retrofit and track the modification done by the test engineer during the on-line debug.

Figure 5:
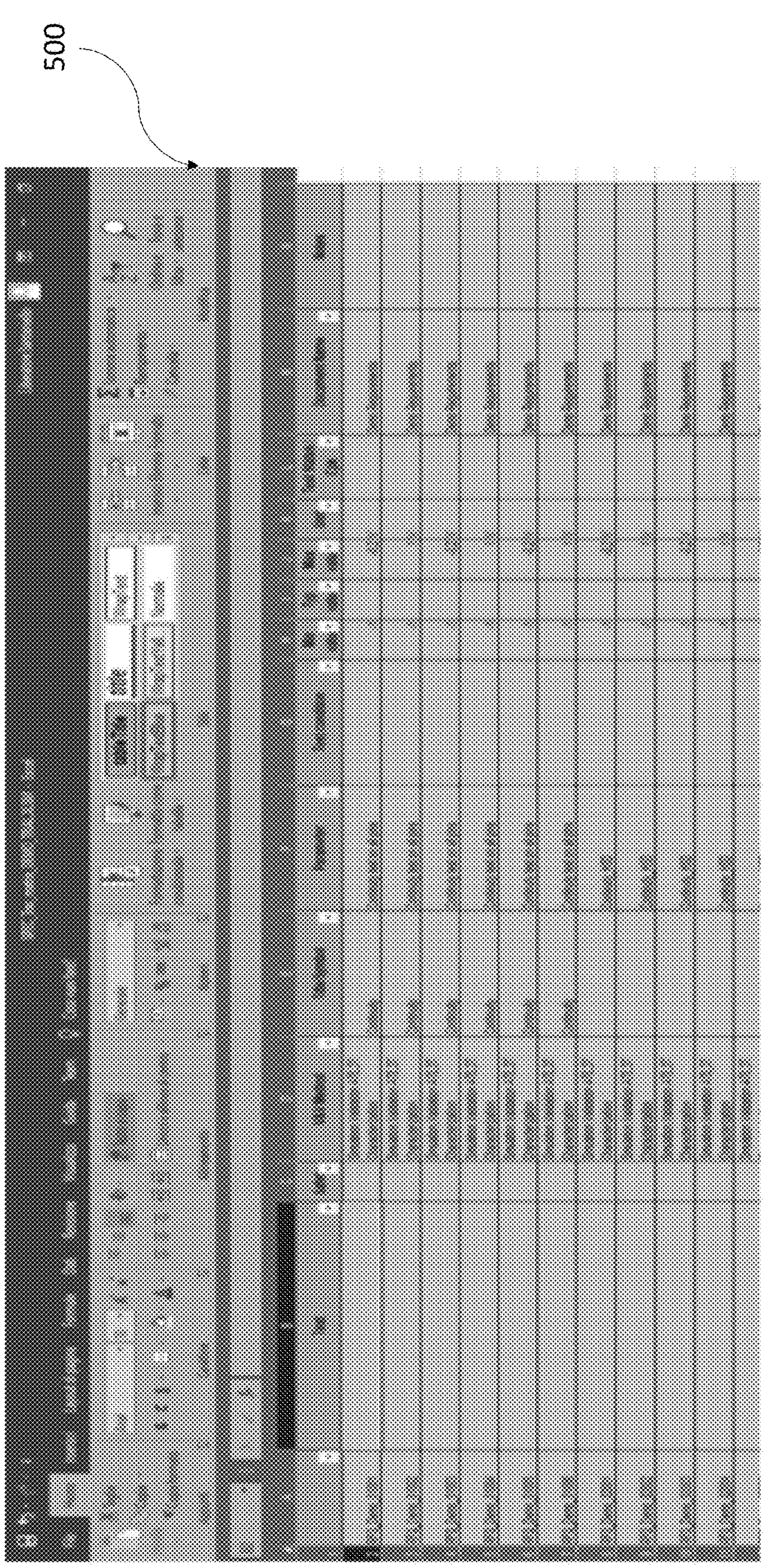
FIG. 5 is an illustrative diagram showing an example of a traceability matrix according to an embodiment of the present invention.

FIG. 5 is an illustrative diagram showing an example 500 of a traceability matrix according to an embodiment of the present invention.

Figure 6:
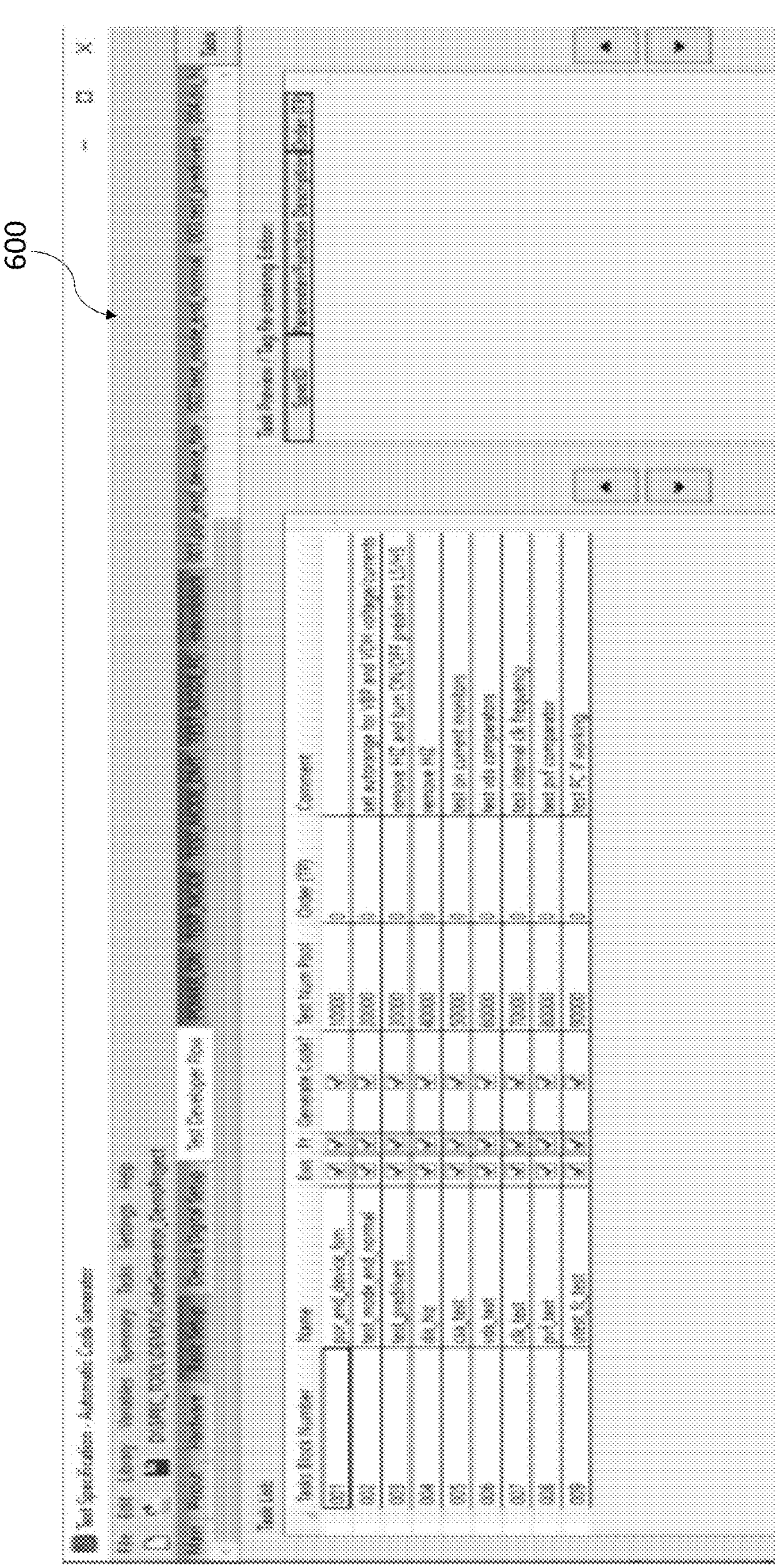
FIG. 6 is an illustrative diagram showing an example of a test project crated in the test specification generating module according to an embodiment of the present invention.

FIG. 6 is an illustrative diagram showing an example 600 of a test project crated in the test specification generating module according to an embodiment of the present invention.

As shown in FIGS. 5 and 6, the traceability matrix may be an excel document containing the list of requirements/parameters to be covered by a specific test in the test program.

For each requirement, the validation method and test limits are specified.

Using the embedded macro, each requirement in the list can be imported inside a spec tool project, automatically creating a "Test Developer Flow" and a list of "Test blocks" inside each task.

Figure 7:
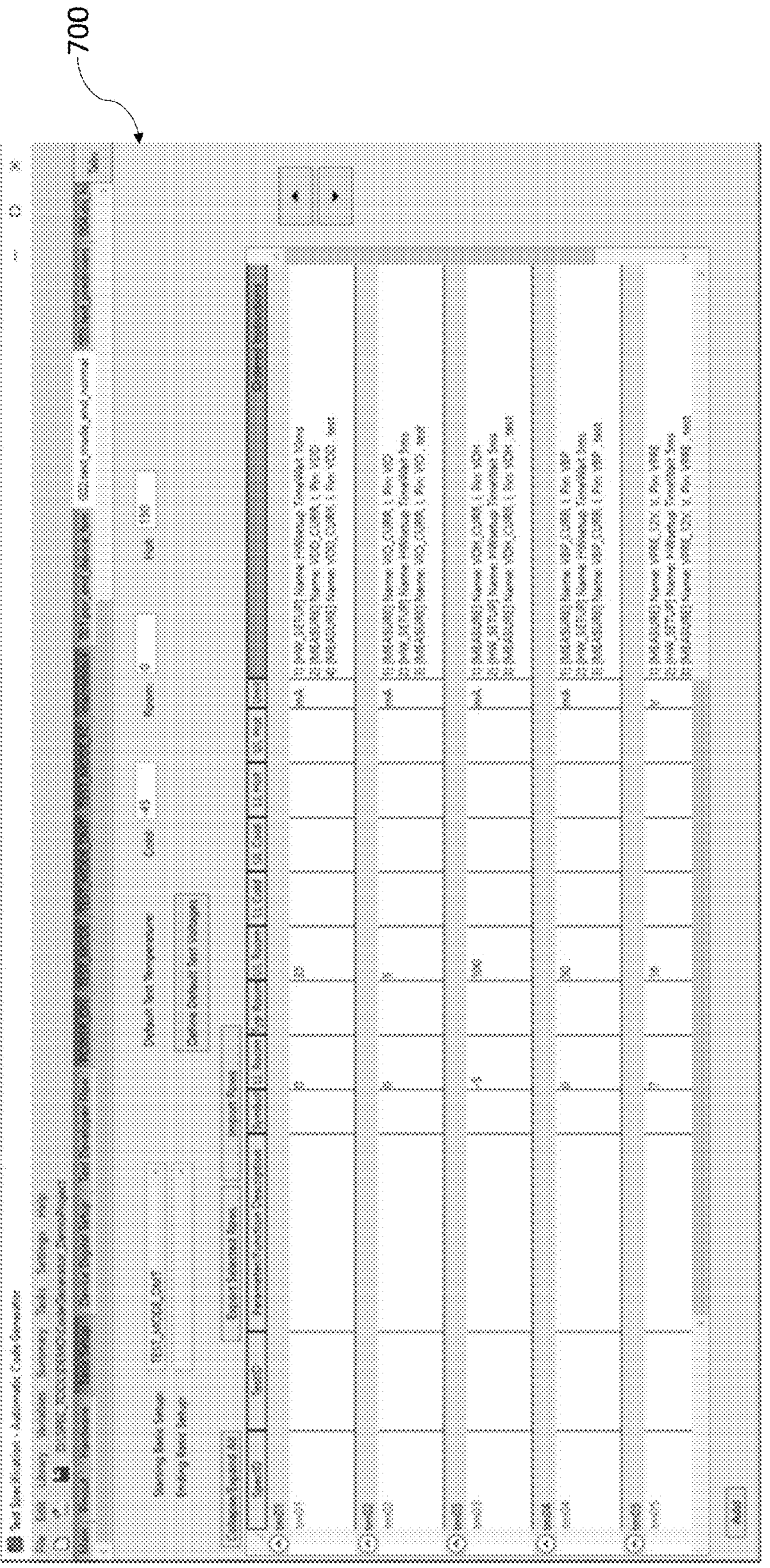
FIG. 7 is an illustrative diagram showing an example of a task implementation according to an embodiment of the present invention.

FIG. 7 is an illustrative diagram showing an example 700 of a task implementation according to an embodiment of the present invention.

As shown in FIG. 7, each task present in the "Test Development Flow" may contain the list of requirements/parameters to be verified in the test program. In addition, the test setup description has to be created for each requirement.

Figure 8:
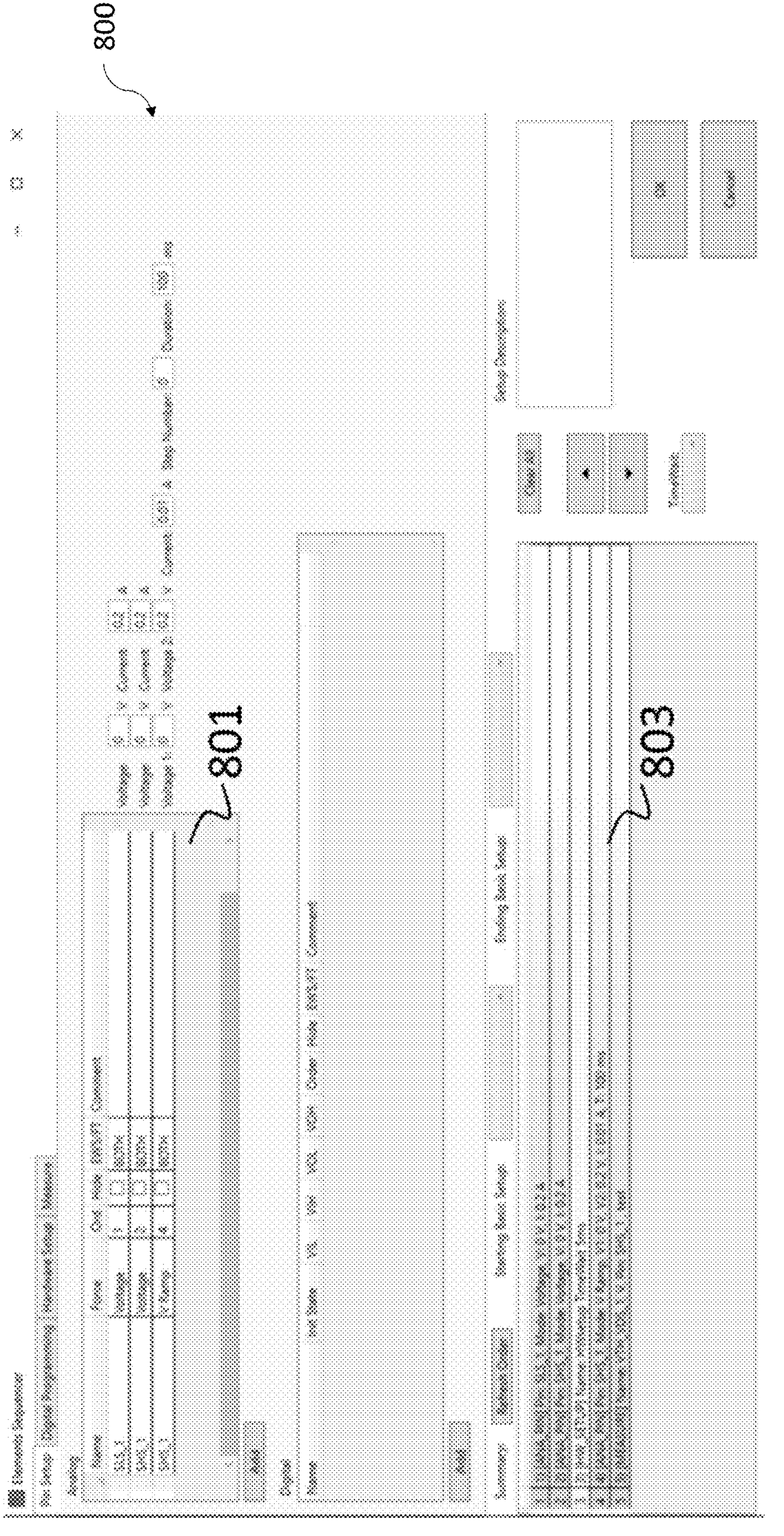
FIG. 8 is an illustrative diagram showing an example of a graphical programming according to an embodiment of the present invention.

FIG. 8 is an illustrative diagram showing an example 800 of a graphical programming according to an embodiment of the present invention.

As shown in FIG. 8, the test setup description can be filled by the test engineer in collaboration with the device designer without needs to have any knowledge about the final ATE platform.

In addition, a graphical interface may support the definition of the specific test setup. For instance, in section 801 shown in FIG. 8, a DUT pin programming (analog/digital) and measurement can be defined filling the suggested parameters. In section 803 shown in FIG. 8, metal language setups are listed and can be easily ordered to define the instruction sequence.

FIG. 9 is an illustrative diagram showing an example 900 of a register map according to an embodiment of the present invention.

Figure 10:
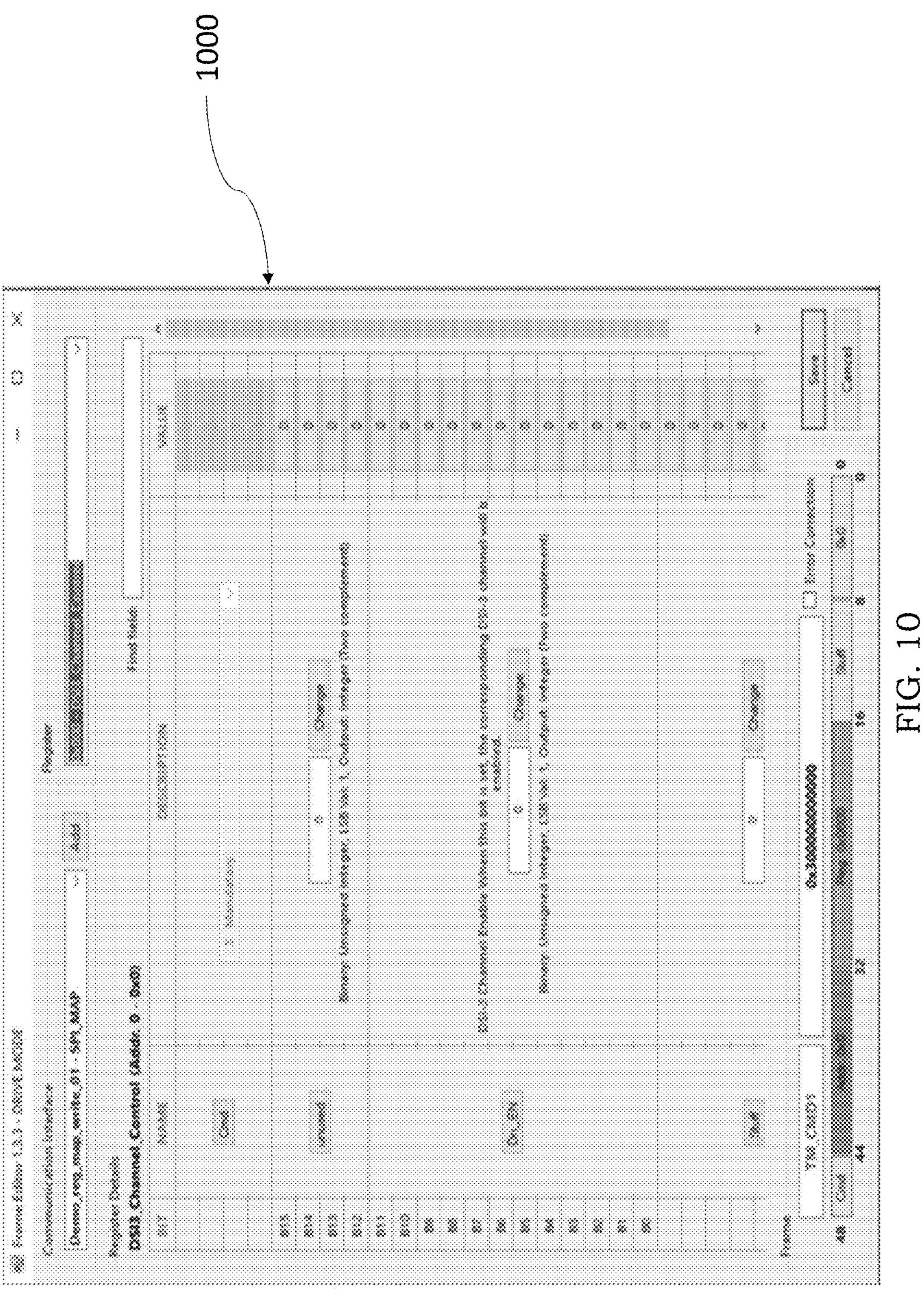
FIG. 10 is an illustrative diagram showing an example of a frame editor according to an embodiment of the present invention.

FIG. 10 is an illustrative diagram showing an example 1000 of a frame editor according to an embodiment of the present invention.

As shown in FIGS. 9 and 10, the register map may be an excel document containing the device register map and communication protocol information, and DUT internal register structure.

Using the embedded macro, the register information can be imported into the specification tool frame manager. The frame manager may support the test engineer and device designer to define the frames through a graphic interface. In addition, the defined frames can be used by the test engineer inside the test setup description selecting the correct frame in a list by its name.

According to the method and system for developing and executing a test program for verifying a DUT of the present disclosure, the optional integration of the AI module in the specification tool can reduce the test program implementation time in the development phases.

Moreover, starting from an existing test program running on the ATE, the output signals of the oscilloscope can be acquired and analyzed also by the integrated AI module in order to automatically replicate all test setups inside a specification tool project and generate the test program on the new target ATE platform.

Moreover, during the test program validation phase on the target ATE platform, the oscilloscope signals can be acquired and analyzed by the integrated AI module in order to automatically perform test program improvement and quality checks (e.g., spike analysis).

Although specific examples have been illustrated and described herein, those of ordinary skill in the art will appreciate that an arrangement to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method of developing and executing a test program for verifying a device under test, comprising:

receiving test data, by a test specification generating module, for generating a test specification including information for generating a test program;

receiving, by a code generating module, the information output from the test specification generating module in order to generate the test program;

executing, by an automatic test equipment, the test program to verify the device under test;

acquiring, by an oscilloscope module, tested signals on pins of the device under test during thea verifying phase of the device under test; and feeding at least an output of the oscilloscope module, which is based on the tested signals, back to the test specification generating module, wherein the test specification generating module is integrated with an artificial intelligence module to analyze the output of the oscilloscope module in order to automatically optimize the test program and perform quality checks; wherein the output of the oscilloscope module is further analyzed by the integrated artificial intelligence module in order to automatically replicate all test setups of the test program to be executed on another automatic test equipment.

2. The method of developing and executing a test program for verifying a device under test of claim 1, wherein a receiving phase of the test data, by the test specification generating module, to generate a test specification including information for generating a test program comprises:

configuring the test data with a support of graphical programming.

3. The method of developing and executing a test program for verifying a device under test of claim 2, wherein the graphical programming is implemented by a graphical interface wherein analog/digital programming and measurement of the pins of the device under test are defined with filing suggested parameters, and meta language setup are listed and ordered to define an instruction sequence.

4. A method of developing and executing a test program for verifying a device under test, comprising:

receiving test data, by a test specification generating module for generating a test specification including information for generating a test program;

receiving, by a code generating module, the information output from the test specification generating module in order to generate the test program;

executing, by an automatic test equipment, the test program to verify the device under test;

acquiring by an oscilloscope module, tested signals on pins of the device under test during a verifying phase of the device under test; and feeding at least an output of the oscilloscope module, which is based on the tested signals, back to the test specification generating module, wherein the test specification generating module is integrated with an artificial intelligence module to analyze the output of the oscilloscope module in order to automatically optimize the test program and perform quality checks; and wherein the test data includes at least a traceability matrix, a device under test register map, a setup description, an optical character recognition description of the device under test, and a standard test data file.

5. The method of developing and executing a test program for verifying a device under test of claim 4, wherein the traceability matrix includes a list of requirements/parameters to be covered by a test in the test program.

6. The method of developing and executing a test program for verifying a device under test of claim 4, wherein the device under test register map includes communication protocol information and device under test internal register structure.

7. The method of developing and executing a test program for verifying a device under test of claim 4, wherein the setup description is created for each requirement and includes a list of requirements/parameters to be verified in the test program.

8. The method of developing and executing a test program for verifying a device under test of claim 4, wherein a text semantic analysis is performed on the optical character recognition description of the device under test through the artificial intelligence module integrated in the test specification generating module.

9. A system of developing and executing a test program for verifying a device under test, comprising:

a test specification generating module configured to receive test data in order to generate a test specification including information for generating a test program;

a code generating module configured to receive the information output from the test specification generating module in order to generate the test program;

an automatic test equipment configured to execute the test program to verify the device under test; and an oscilloscope module configured to acquire tested signals on pins of the device under test during verifying the device under test, and feed at least an output of the oscilloscope module, which is based on the tested signals, back to the test specification generating module, and wherein the test specification generating module is integrated with an artificial intelligence module to analyze the output of the oscilloscope module in order to automatically optimize the test program and perform quality checks;

wherein the output of the oscilloscope module is further analyzed by the integrated artificial intelligence module in order to automatically replicate all test setups of the test program to be executed on another automatic test equipment.

* * * * *